United States Patent [19]

Mitchell, Jr.

[11] Patent Number: 4,607,685

[45] Date of Patent: Aug. 26, 1986

[54] HEAT SINK FOR INTEGRATED CIRCUIT PACKAGE

[75] Inventor: John W. Mitchell, Jr., Pasadena, Calif.

[73] Assignee: Burroughs Corporation, Detroit, Mich.

[21] Appl. No.: 628,225

[22] Filed: Jul. 6, 1984

[51] Int. Cl.[4] .......................................... H01L 23/40
[52] U.S. Cl. .................................... 165/80.3; 165/185
[58] Field of Search ................. 168/80 R, 80 A, 80 B, 168/80 C, 80 D, 80 E, 185; 174/16 HS; 357/81 R, 81 A, 82; 361/383, 386, 388; 165/80.1, 80.2, 80.3, 80.4, 80.5

[56] References Cited

U.S. PATENT DOCUMENTS 3,241,605  3/1966  Tabor ................................. 165/80 B
3,261,904  7/1966  Wulc .................................. 165/80 B
3,874,443  4/1975  Bayer ................................. 165/80.3

OTHER PUBLICATIONS

Combined Heat Conductor and Protective Transistor Package, Hardwick-BTL et al., Western Electric Technical Digest, No. 25, Jan. 1972, pp. 39–40.

Primary Examiner—Sheldon J. Richter
Attorney, Agent, or Firm—Alfred W. Kozak; Nathan Cass; Kevin R. Peterson

[57] ABSTRACT

A heat exchange attachment device for integrated circuits is presented which eliminates any need for contact with adhesive pastes or solder. A snap-on holding piece permits a finned cooling unit to be threaded through an aluminum base plate attached to the pin grid array package so that a threaded shaft of the cooling unit may be screwed into adjustable contact with a beryllium oxide disk mounted on the integrated circuit package.

8 Claims, 2 Drawing Figures

ASSEMBLED HEAT SINK ON PIN GRID ARRAY PACKAGE.

HEAT SINK FOR INTEGRATED CIRCUIT PACKAGE

BACKGROUND OF THE INVENTION

One of the basic and recurring problems in the present day electronic industry involves the dissipation of heat from highly concentrated pin grid arrays packaged rather densely on printed circuit boards.

The generally known means for dissipating the heat generated in these concentrated spatial areas is by the attachment of heat sinks to the pin grid array package. There are presently two basic methods whereby heat sinks are attached to a pin grid array package in the present art. These methods are (1) to solder a heat sink to the metalized surface of a pin grid array package, and (2) to attach a heat sink with an adhesive paste or fluid).

There are some major disadvantages in each of these presently used methods.

Those heat sinks that are soldered to the pin grid array package are generally required to have relatively small contact area between the package and the heat sink. This is due to the thermal coefficient of expansion of the different materials used and which are thus mismatched in their coefficient of expansion. For example, the normal materials which are used such as beryllium oxide, and copper, or aluminum, each have a different coefficient of expansion. However, this requirement of a small contact area operates to limit the conduction path for heat to be transferred over to the heat sink.

When a heat sink is attached by means of adhesive paste or adhesive solutions, the thermal expansion mismatch problem is generally eliminated. However, there is a disadvantage to the adhesives in that they are considered to be unreliable in certain circumstances and when a failure occurs, the failure of the heat sink will cause failure of the integrated circuits and thus present a considerable risk to the integrated circuit and surrounding circuitry when adhesives are used as a means of heat sink attachment.

For example, a varying number of heat cycles or a number of thermal shocks or a number of actual physical shocks may operated to break or disconnect the adhesive solution and thus prevent the heat sink from having sufficient contact to dissipate the heat, causing the loss of the integrated circuits.

With the basic consideration that a mechanical system of holding the heat sink to a chip is much more reliable than either solder or adhesive connection, it was felt possible to design and build an unusually large conduction path without incurring the thermal expansion mismatch problem. Further, the mechanical connection also permits an adjustable pressure to be developed between the heat sink and the pin grid package which can also be helpful to improve the heat transfer factors. Accordingly, the presently described heat sink configuration was developed to overcome the limitations of previous methods of attaching heat sinks to a pin grid array.

SUMMARY OF THE INVENTION

The present heat sink attachment embodiment involves a clip-on plastic holding piece, which holding piece has two opposite cantilevered sides whereby the thumb and forefinger can be used to expand the distance of the lower extremities of the holding piece so that the holding piece can be snapped around a pin grid array package.

The pin grid array package has centrally mounted on its top a beryllium oxide disk over which resides an aluminum base plate having a threaded aperture in its central area. Then a set of aluminum cooling fins having a threaded shaft can be placed through a central aperture of the plastic holding piece to thread its way through the aluminum base plate and on to the beryllium oxide disk, thus forming a stable and effective heat transfer system for heat generated within the pin grid array package.

While one make of integrated circuit package is manufactured with a beryllium oxide contact plate (which is basically a ceramic having metallic heat transfer conductivity), other makes of integrated circuit packages may have top-contact plates of aluminum oxide, copper or other heat conductive material. Some IC packages merely have an alumina jacket. In any case, the described heat sink device can be simply attached to the IC package to provide efficient heat transfer from the package.

DESCRIPTION OF THE PREFERRED EMBODIMENT

The heat sink attachment configuration described herein allows a large conduction path for a pin grid array without incurring any thermal expansion mismatch problem. Further, the mechanical bond is a highly reliable method of attachment, in addition to the fact that the mechanical contact pressure between the heat sink and the package can be made adjustable.

Figure 1:
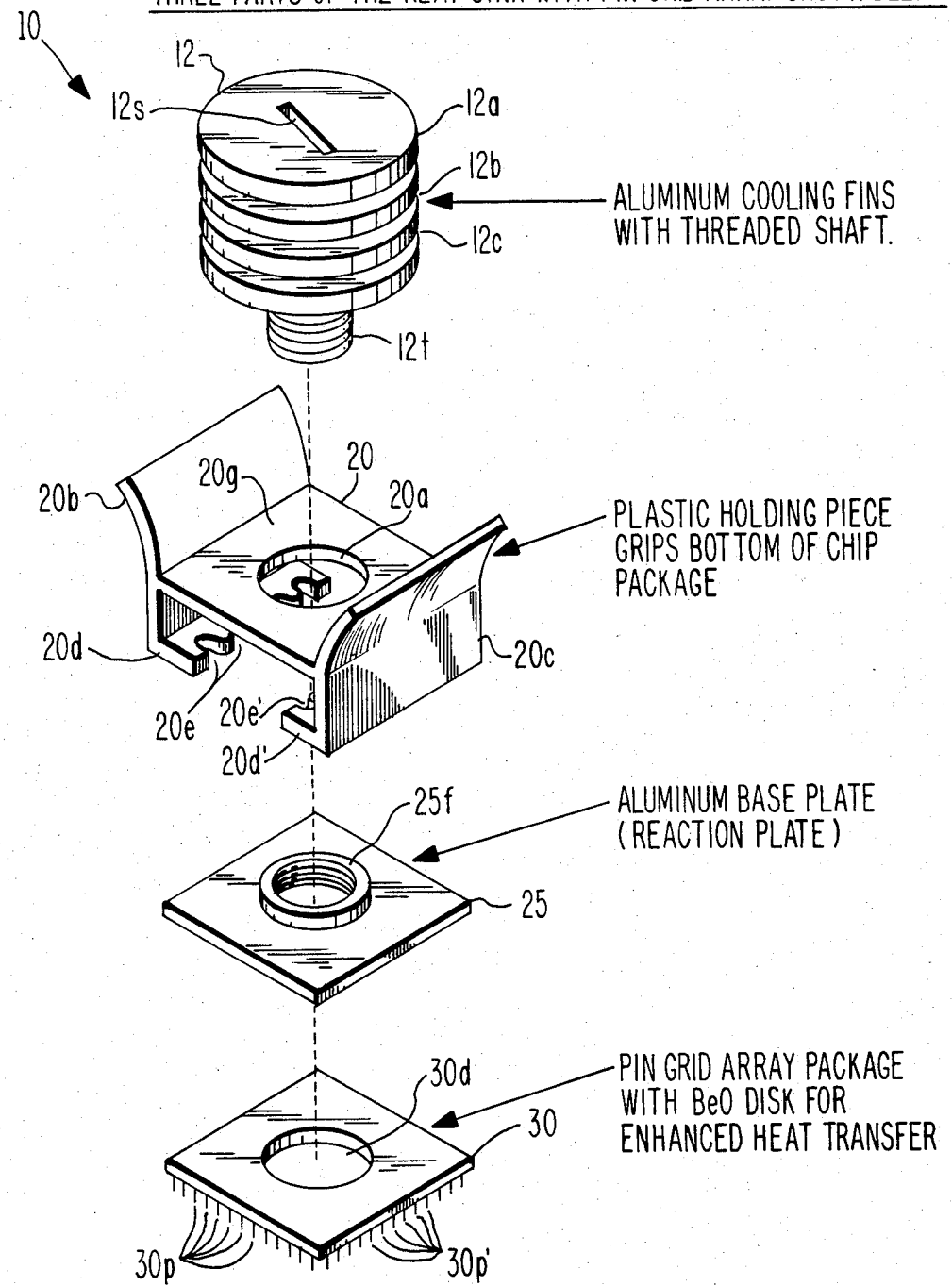
FIG. 1 shows an exploded view of a schematic drawing which illustrates the various components of the improved heat sink attachment package.

Referring to FIG. 1, there is shown a pin grid array package 30 having underlying pins $30_p$ with the top surface being centrally mounted with a beryllium oxide disk $30_d$.

Then for placement on to the top of the pin grid array package, there is shown an aluminum base plate 25 having a centrally raised boss $25_f$ and a central aperture having a threaded internal circumference.

The pin grid array package 30 and the aluminum base plate 25 are mounted on the underside of the plastic holding piece or retainer 20. The plastic holding piece 20 is made up of a horizontal central plane $20_g$ at the ends of which are connected two vertical end planes $20_b$ and $20_c$. The lower portions of these vertical end planes will each have a foot area $20_d$ into which there are serrated openings $20_e$ which can snap around the underbody pins $30_p$.

The plastic holding piece 20 is preferably made of a polycarbonate plastic having 30% glass fiber such as plastics of the type called "Lexan".

The structure of the plastic holding piece is such that the thumb and forefinger can grip the upper portions of the vertical end planes $20_b$ and $20_c$ in order to cause an extension of the distance between the two foot areas $20_d$ and $20_d'$, thus to permit the plastic holding piece to be placed around the pin grid array package so that it may snap into place and thus hold the grid array package.

The horizontal base $20_g$ of the plastic holding piece 20 has a central portion which is cut out to form the aperture $20_a$. This aperture may be circular, rectangular or other formed shape.

The cooling unit 12 may preferably be embodied as cylindrical aluminum cooling fins $12_a$, $12_b$, $12_c$ and the unit may have an elongated shaft which is threaded and shown as $12_t$.

Figure 2:
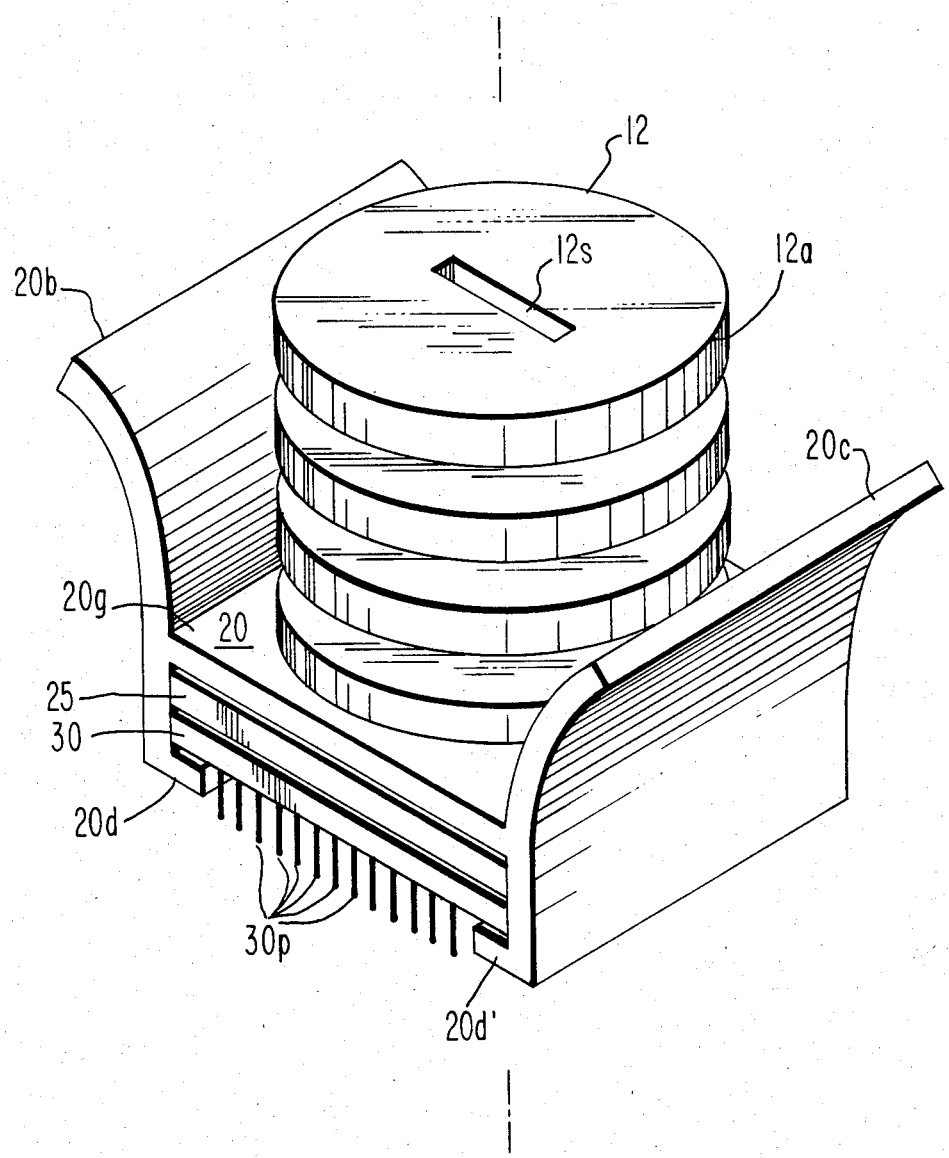
FIG. 2 is a isometric drawing which illustrates the completed package as assembled around the pin grid array and ready to function as a heat dissipation device.

FIG. 2 shows a completely assembled embodiment of the presently described heat sink attachment.

The cylindrical cooling fins and the cooling unit 12 have been screwed down through the aperture $20_a$ and through the raised boss $25_f$ in order to contact the beryllium oxide disk $30_d$.

A screw driver slot $12_s$ is provided for the cooling unit 12 in order to permit screw driver adjustment of the tension involved as the cooling unit 12 resides in the plastic holding piece.

Thus, in FIG. 2 there is now seen the plastic holding piece 20 gripping the pin grid array package 30 and the aluminum base plate 25 which resides above it.

Thus, the complete package is now attached and functionally operable for dissipation of heat from the pin grid array 30, whereby the heat can be transferred very efficiently from the beryllium oxide disk $30_d$ through the aluminum base plate 25 and on to the threaded shaft $12_t$ on to the cooling fins 12.

In high density packaging applications there is a very limited volume allotment for heat exchange and heat dissipation devices because of the proximity of printed circuit boards one to another in electronic cabinetry.

Thus, it is a factor of importance that the size and volume constraints be considered so that it is possible to provide devices which give the most effective cooling area for a given volume.

Generally, the heat that is transferred from pin grid array devices is placed into some sort of a heat sink whereby the ambient air which is blown over the heat sink may serve to dissipate the heat that has accumulated.

One of the major problems involved in heat sinks or heat exchange devices is the transfer of heat factor.

The heat exchange attachment device 10 of the present disclosure is most suitable for forced air cooling in that the finned areas of the cooling unit 12 present a minimally resistive surface to the flow of air.

The aluminum base plate 25 can be called a "reaction plate" in the sense that it provides a spring action which helps to apply pressure on the beryllium oxide plate $30_d$ and on the cylindrical extension $12_t$. Thus, it helps maintain good contact during heat cycling and it helps inhibit the loosening of the fin unit 12 and its threaded extension $12_t$.

The heat exchange attachment unit of the present invention may be designed in several size configurations in order to snap on to different size pin grid array packages. Further, the cooling unit 12 can be designed to have one fin, two fins, three fins or even another type of configuration whereby fins are presented to the bypassing air for cooling, yet at the same time the cooling unit provides the threaded connecting screw $12_t$ which can be adjusted to contact the beryllium oxide heat disk with a varying pressure according as the slot $12_s$ is used to apply torque to the cooling device.

While the preferred embodiment is illustrative of the features of this disclosure, other embodiments are possible which also fall within the scope of the following claims recited hereinbelow.

What is claimed is:

1. A heat exchange device for an IC pin chip package comprising:
    (a) gripping means for attachment to said chip package and having a central aperture, wherein said gripping means includes:
        (a1) a flexible planar area around said central aperture;
        (a2) first and second legs extending at right angles to said planar area, said legs acting to grip said chip package;
    (b) cover unit means including:
        (b1) a beryllium oxide disk connected to the top of said chip package;
        (b2) a metallic base plate for covering the top of said chip package, and having a threaded central aperture;
    (c) metallic fin means having a threaded extension cylinder for insertion through said gripping means and said metallic base plate for contact with said beryllium oxide disk.

2. The device of claim 1, wherein each of said first and second legs include:
    (a) a strip foot extending inwardly at right angles to each of said legs for grasping said chip package.

3. The device of claim 2, wherein each said strip foot includes:
    serrated edge cut-outs for avoidance of contact with pins situated on the underside of said chip package.

4. In a heat sink apparatus for an integrated circuit pin chip array package, wherein each package supports a centrally located beryllium disk attached to the top of said chip package, the combination comprising:
    (a) gripping means having two legs for clasping said chip package and including:
        (a1) a first central aperture for enabling passage of a threaded extension cylinder;
    (b) a metallic base plate for covering the top of said chip package and including:
        (b1) a second central aperture above said beryllium disk and including internal circumferential threads for engaging said threaded extension cylinder;
    (c) metallic cooling fin means which includes:
        (c1) said threaded extension cylinder for insertion through said gripping means and for threaded engagement through said metallic base plate for physical contact with said beryllium oxide disk.

5. The combination of claim 4, wherein said two legs of said gripping means each include:
    (a) feet extension strips for attachment to the underside of said pin grid package.

6. The combination of claim 5, wherein each of said feet extension strips include:
    (a) serrated cut-outs for non-interference with pin arrays on the underside of said pin grid package.

7. In a heat sink apparatus for integrated circuit chip packages having a centrally located beryllium oxide disk attached to the top of said chip package, the combination comprising:
    (a) a snap-on unit for attachment to an IC package, said unit including:
        (a1) a flexible planar area having a central aperture and two opposite ends wherein each end supports a lip extension at right angles to said planar area, said lip extension being capable of gripping said chip package;

(b) metallic cooling fin means having a threaded extension means for screw attachment to a base plate;
(c) a metallic base for covering said IC chip package and including:
  (c1) a central aperture having a threaded internal circumference for screw-attachment of said threaded extension means.

8. In a heat sink apparatus for an integrated circuit chip package with conductive pins on the underside, and having an outer heat-conductive jacket, the combination comprising:
(a) a snap-on unit for attachment to said chip package, said unit including:
  (a1) a flexible planar area having a central aperture and two opposite ends wherein each end supports a lip extension means at right angles to said planar area, said lip extension means being capable of gripping said chip package;
  (a2) first and second lip extension means wherein each said lip extension means includes:
    (a2a) an upper lip section responsive to finger pressure for flexing outwardly a lower lip section;
    (a2b) said lower lip section for returning to and holding a fixed position against said integrated circuit chip package, and wherein each said lower lip section includes:
      (i) a strip foot extending inwardly and parallel to said planar area, said strip foot having a series of cut-outs for avoidance of contact with conductive pins on the underside of said chip package;
(b) heat conductive cooling fin means having a threaded extension means for screw attachment to a base plate;
(c) a heat conductive base plate for contacting said jacket of said chip package and including:
  (c1) a central aperture having a threaded internal circumference for screw-attachment of said threaded extension means.

\* \* \* \* \*